United States Patent
Anwar et al.

(10) Patent No.: US 7,180,212 B2
(45) Date of Patent: Feb. 20, 2007

(54) ELECTRIC MACHINE WITH INTEGRATED ELECTRONICS IN A CIRCULAR/CLOSED-LOOP ARRANGEMENT

(75) Inventors: Mohammad N. Anwar, Van Buren Township, MI (US); Mehrdad Teimor, Troy, MI (US); Richard E. Luken, West Bloomfield, MI (US); Jeffrey J. Brautigan, Livonia, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 306 days.

(21) Appl. No.: 10/884,725

(22) Filed: Jul. 2, 2004

(65) Prior Publication Data

US 2006/0002054 A1   Jan. 5, 2006

(51) Int. Cl.
*H02K 11/00* (2006.01)

(52) U.S. Cl. ...................... 310/68 R; 310/71
(58) Field of Classification Search .......... 310/68 R, 310/71, 42–43, 179
See application file for complete search history.

(56) References Cited

U.S. PATENT DOCUMENTS

| | | | |
|---|---|---|---|
| 3,754,152 A * | 8/1973 | Koehler et al. ............. 310/318 |
| 4,724,347 A * | 2/1988 | Reinhardt et al. ........ 310/68 R |
| 5,491,370 A | 2/1996 | Schneider et al. |
| 5,689,148 A | 11/1997 | Rubinchik |
| 5,773,907 A | 6/1998 | Rubinchik |
| 5,796,196 A | 8/1998 | Johnsen et al. |
| 5,828,554 A | 10/1998 | Donegan et al. |
| 6,111,328 A | 8/2000 | Ota et al. |
| 6,160,696 A | 12/2000 | Bailey et al. |
| 6,177,740 B1 | 1/2001 | Burns |
| 6,198,183 B1 | 3/2001 | Baeumel et al. |
| 6,236,126 B1 | 5/2001 | Yagi et al. |
| 6,297,572 B1 | 10/2001 | Sunaga et al. |
| 6,307,289 B1 | 10/2001 | Skala |
| 6,326,761 B1 | 12/2001 | Tareilus |
| 6,356,003 B1 | 3/2002 | Fiorenza et al. |
| 6,380,728 B1 | 4/2002 | Tareilus et al. |
| 6,448,676 B1 | 9/2002 | Kershaw et al. |
| 6,617,719 B2 | 9/2003 | Sunaga et al. |
| 6,661,134 B2 | 12/2003 | Sunaga et al. |
| 6,894,411 B2 * | 5/2005 | Schmid et al. ................ 310/71 |
| 2002/0093259 A1 | 7/2002 | Sunaga et al. |
| 2003/0173839 A1 | 9/2003 | Torii et al. |
| 2003/0178896 A1 | 9/2003 | Crane |
| 2003/0227222 A1 | 12/2003 | Tabatowski-Bush et al. |
| 2004/0021376 A1 | 2/2004 | Beulich |
| 2004/0027014 A1 * | 2/2004 | Weigold et al. ........... 310/68 R |
| 2004/0124726 A1 * | 7/2004 | Hans ........................... 310/71 |

* cited by examiner

*Primary Examiner*—Thanh Lam
(74) *Attorney, Agent, or Firm*—Brinks Hofer Gilson & Lione

(57) ABSTRACT

An electric machine including multiple windings, a switch circuit connected to each of the windings, a positive bus bar, and a negative bus bar. The switch circuits are in communication with the windings to selectively energize each of the windings. The positive bus bar is a conductive plate connected to the switch circuits and the negative bus bar is a conductive plate positioned substantially parallel to the positive bus bar and connected electrically to the switch circuits.

13 Claims, 5 Drawing Sheets

ELECTRIC MACHINE WITH INTEGRATED ELECTRONICS IN A CIRCULAR/CLOSED-LOOP ARRANGEMENT

BACKGROUND

1. Field of the Invention

The present invention generally relates to a bus bar configuration for an electric machine.

2. Description of Related Art

Electric machines and switch configurations for controlling electrical machines are well developed in the art. Typically, the switching electronics are packaged and mounted separately from the electric machine. With the switching electronics and electric machine typically connected through multiple connectors and a wire harness, it is advantageous to reduce the number of connectors and wire harnesses to improve system reliability and decrease system cost. In addition, the elimination of such connections reduces electrical noise and cross talk between adjacent electrical systems.

Conventionally, a bus bar and switch circuits are laid out linearly on a circuit board in a open loop configuration. The open loop or linear arrangement of the switch circuits causes the distance between each switching circuit and capacitor to vary. Therefore, filtering and snubbing capacitance is not equally shared among the switch circuits, due to the asymmetric layout of the circuit board. The unequal sharing of such capacitance may cause slight timing delays between the switch circuits, exposing certain switches to an unequal amount of current thereby overloading the switch during the delay and causing potential reliability issues.

In view of the above, it is apparent that there exists a need for an improved bus bar configuration for an electric machine.

SUMMARY

In satisfying the above need, as well as overcoming the enumerated drawbacks and other limitations of the related art, the present invention provides an electric machine with an improved bus bar configuration.

The electric machine includes multiple windings, a switch circuit connected to each of the windings, a positive bus bar, and a negative bus bar. The switch circuits are in communication with the windings to selectively energize each of the windings. The positive bus bar is a conductive plate connected to the switch circuits. The negative bus bar is a conductive plate positioned substantially parallel to the positive bus bar and connected electrically to the switch circuits.

In one aspect of the present invention, the switch circuits, the negative bus bar, and the positive bus bar are mounted to the housing of the electrical machine, or located within the housing along with the windings.

In another aspect of the present invention, the switch circuits are mounted in a symmetric configuration, such as a circle, along a surface of the positive or negative bus bar. The switch circuits may be made of half bridge circuits connected between the positive and negative bus bar. Capacitors are mounted to the positive and negative bus bar and positioned in a circular configuration concentric with the configuration of switch circuits. As such, the capacitive bank of the capacitors is located an equal distance from each of the switch circuits. In addition, current sensors may be mounted along the surface of a positive or negative bus bar.

In a further aspect of the present invention, a dielectric layer is disposed between the positive and negative bus bars and located between a substantially flat surface on the positive bus bar and a substantially flat surface on the negative bus bar. The dielectric layer electrically isolates the positive bus bar from the negative bus bar. The thickness of the positive bus bar, the negative bus bar, and the dielectric layer may be minimized to maximize the capacitance and minimize the inductance between the positive and negative bus bar.

Further objects, features and advantages of this invention will become readily apparent to persons skilled in the art after a review of the following description, with reference to the drawings and claims that are appended to and form a part of this specification.

DETAILED DESCRIPTION

Figure 1:
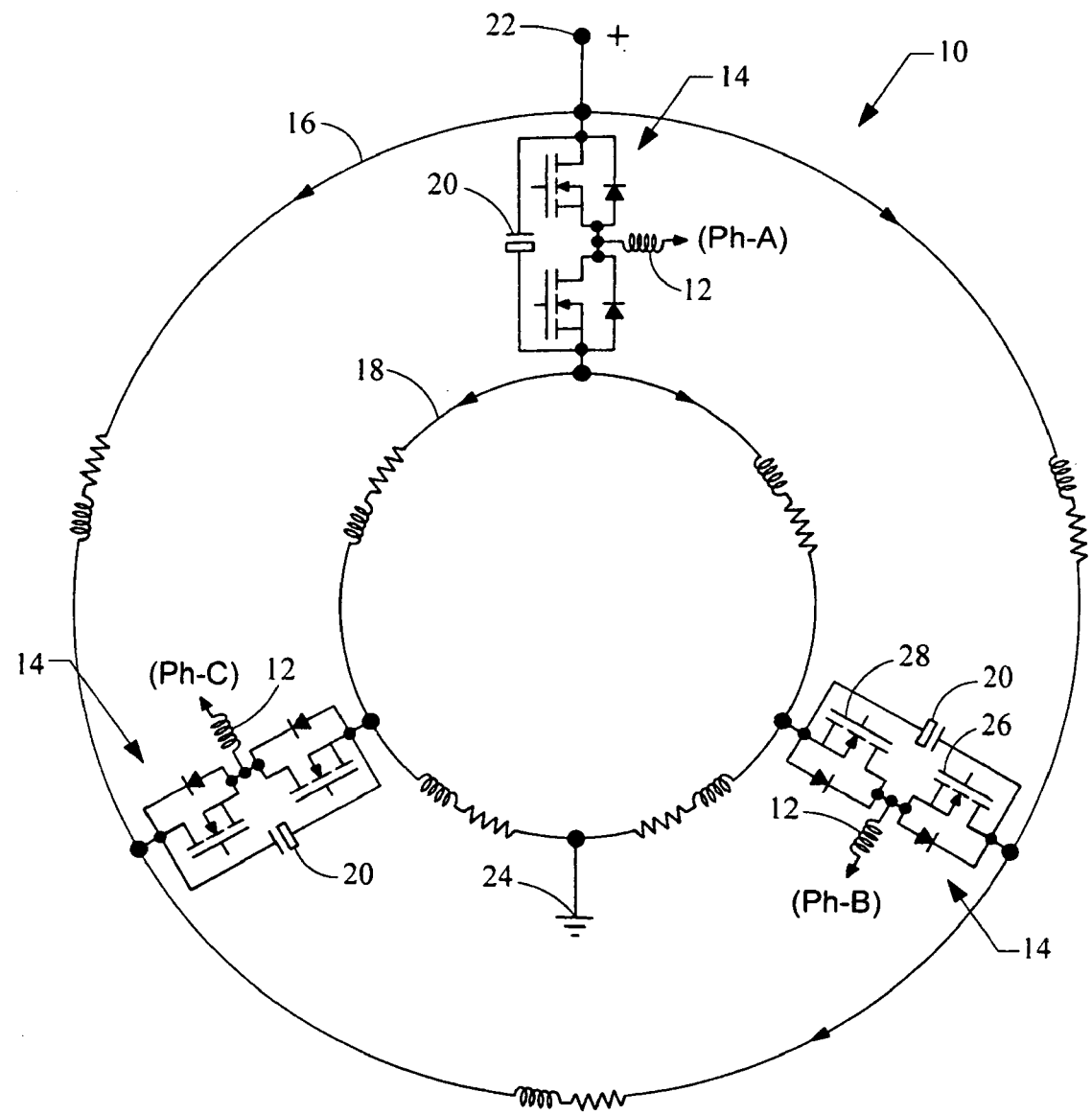
FIG. 1 is a circuit diagram of a circular bus bar configuration for a three phase permanent magnet or induction machine, in accordance with the principles of the present invention.

Referring now to FIG. 1, an electrical machine embodying the principles of the present invention is illustrated therein and designated at 10. The electrical machine 10 includes windings 12, switch circuits 14, a positive bus bar 16 and a negative bus bar 18. In the configuration shown, for a three phase permanent magnet or induction machine, one switching circuit 14 is connected to each phase or winding 12 to selectively energize each of the windings 12.

The switch circuit 14 is connected between the positive bus bar 16 and the negative bus bar 18. Each switch circuit 14 is shown as a half bridge configuration. As such, a first MOSFET 26 is connected between the positive bus bar 16 and the winding 12. Similarly, a second MOSFET 28 is connected between the winding 12 and the negative bus bar 18. Each of the MOSFETs 26 and 28 are controlled by a gate driver circuit (not shown) to energize the windings 12 of the electric machine 10. Although each switch circuit 14 is shown as a half bridge configuration using a pair of MOSFETs, a buck boost configuration using a MOSFET and a diode may alternatively be used. In addition, other switches such as IGBTs or other common solid state switches may be used.

To provide the power for energizing the windings 12, the positive bus bar 16 is connected to the positive side of a power source 22, typically a battery in automotive applications. The negative bus bar 18 is connected to an electrical ground 24 to complete the electrical circuit. Capacitors 20 are connected in parallel with the switch circuits 14 to filter and snub switching transients. Due to the construction and layout of the circuit, the capacitors 20 are essentially connected between the positive bus bar 16 and the negative bus bar 18.

Further, it is to be noted that the closed loop configuration of both the positive and negative bus bar 16, 18 are such that an electrical connection exists between the positive side of each of the switch circuits 14, through positive bus bar 16, and an electrical connection exists between the negative side of each of the switch circuits 14, through the negative bus bar 18.

Although the positive bus bar 16 and the negative bus bar 18 are shown in the circuit diagram as two circles having different circumferences in the physical construction of the electric machine 10, the negative and positive bus bars 16, 18 are configured as plates positioned in a parallel configuration. The parallel plate configuration minimizes the impedance between each of the components mounted on the positive and negative bus bar 16, 18. The parallel plate configuration also provides an integrated and compact package including the positive bus bar 16, the negative bus bar 18, and switch circuits 14, together with the electrical machine itself, eliminating external connectors. Further, the circular bus bar arrangement can be used for any number of phases with a multiple number of half bridge switch circuits per phase.

Figure 2:
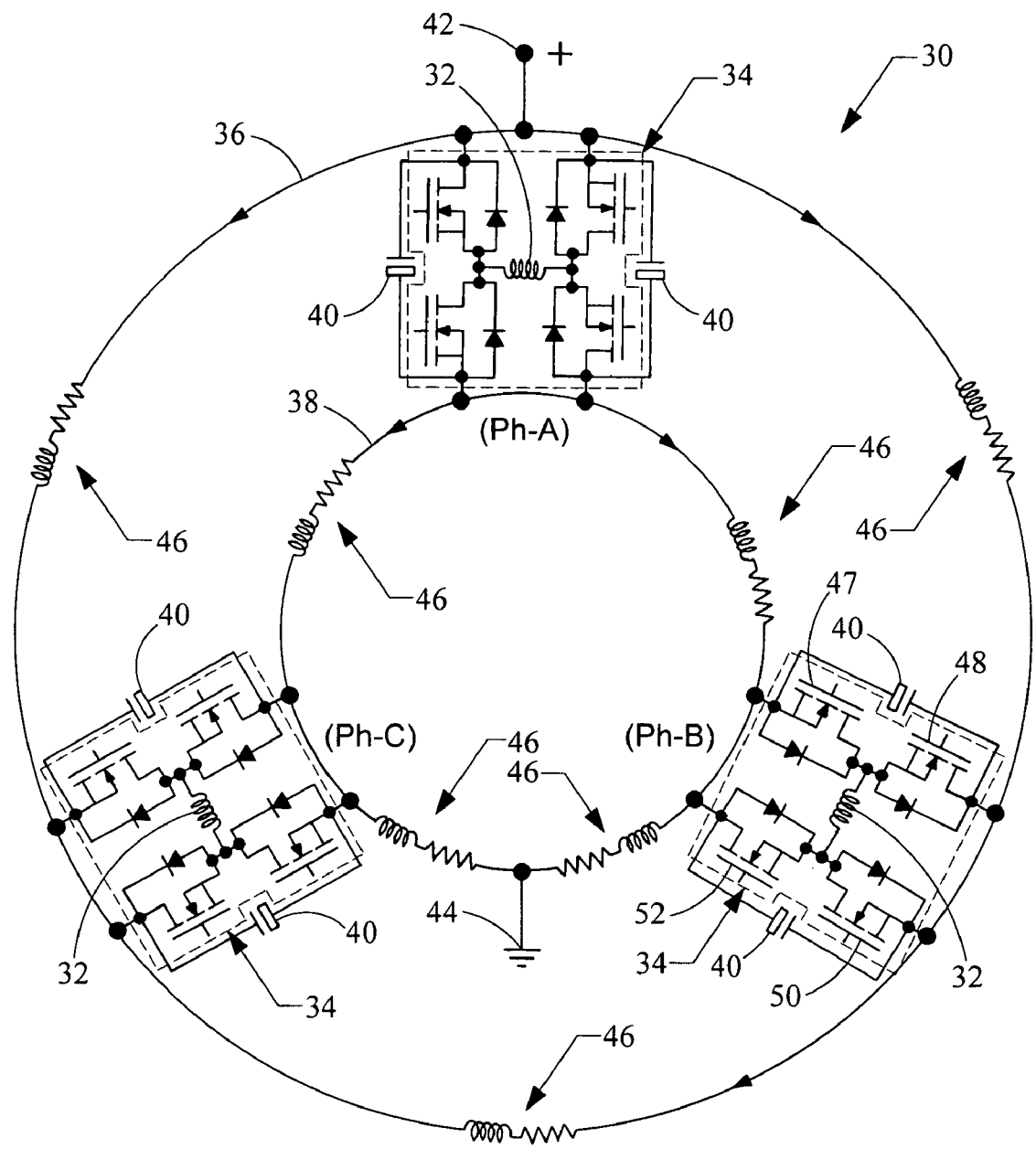
FIG. 2 is a circuit diagram of a circular bus bar configuration for a three phase 6/4 switch reluctance machine, in accordance with the principles of the present invention.

Referring now to FIG. 2, shown therein is a closed loop bus bar configuration or circuit for a switched reluctance machine. One switch circuit 34 is connected to each phase or winding 32 to selectively energize each of the windings 32. As in the prior embodiment, the switch circuit 34 is connected between the positive bus bar 36 and the negative bus bar 38. Each switch circuit 34 is shown as a pair of half bridge configurations per phase or winding 32. However, this bus bar configuration can be used for any machine configuration including multiple phase and repetition machines with multiple numbers of half bridges per phase.

As such, one half bridge configuration of the switch circuit 34 includes a first MOSFET 48 between the positive bus bar 36 and the first side of the winding 32. Similarly, a second MOSFET 47 is connected between the first side of the winding 32 and the negative bus bar 38. Likewise, via the second half bridge configuration the second side of the winding 32 is connected to the positive bus bar 36 through a third MOSFET 50 and to the negative bus bar 38 through a fourth MOSFET 52. Other configurations of semiconductor switches may be used, for example, IGBTs. Or alternatively, a buck boost configuration may be used, for example, by substituting diodes in the form of the first MOSFET 48 and the fourth MOSFET 52.

To provide the power for energizing the windings 32, the positive bus bar 36 is connected to the positive side 42 of the power source, typically a battery in automotive applications. The negative bus bar 38 is connected to an electrical ground 44 to complete the electrical circuit.

For each half bridge of the half bridge pairs, capacitors 40 are connected in parallel to filter and snub switching transients. Due to the construction and layout of the circuit 30, the capacitors 40 are essentially connected between a positive bus bar 36 and the negative bus bar 38.

As previously noted, the closed loop configuration of both the positive and negative bus bars 36, 38 are such that an electrical connection exists between the positive side of each of the switch circuits 34, through positive bus bar 36, and an electrical connection exists between the negative side of each of the switch circuits 34, through the negative bus bar 38. The positive bus bar 36 and the negative bus bar 38 are shown in the circuit diagram of FIG. 2 as two circles having different circumferences. However, the negative and positive bus bars 36, 38 are physically configured as plates positioned in parallel with one another. The parallel plate configuration minimizes the bus bar impedance, as denoted by numeral 46, between each of the components mounted on the positive and negative bus bar 36, 38. Further, the circular bus bar arrangement can be used for any number of phases with multiple number of half bridge switch circuits per phase.

Figure 3:
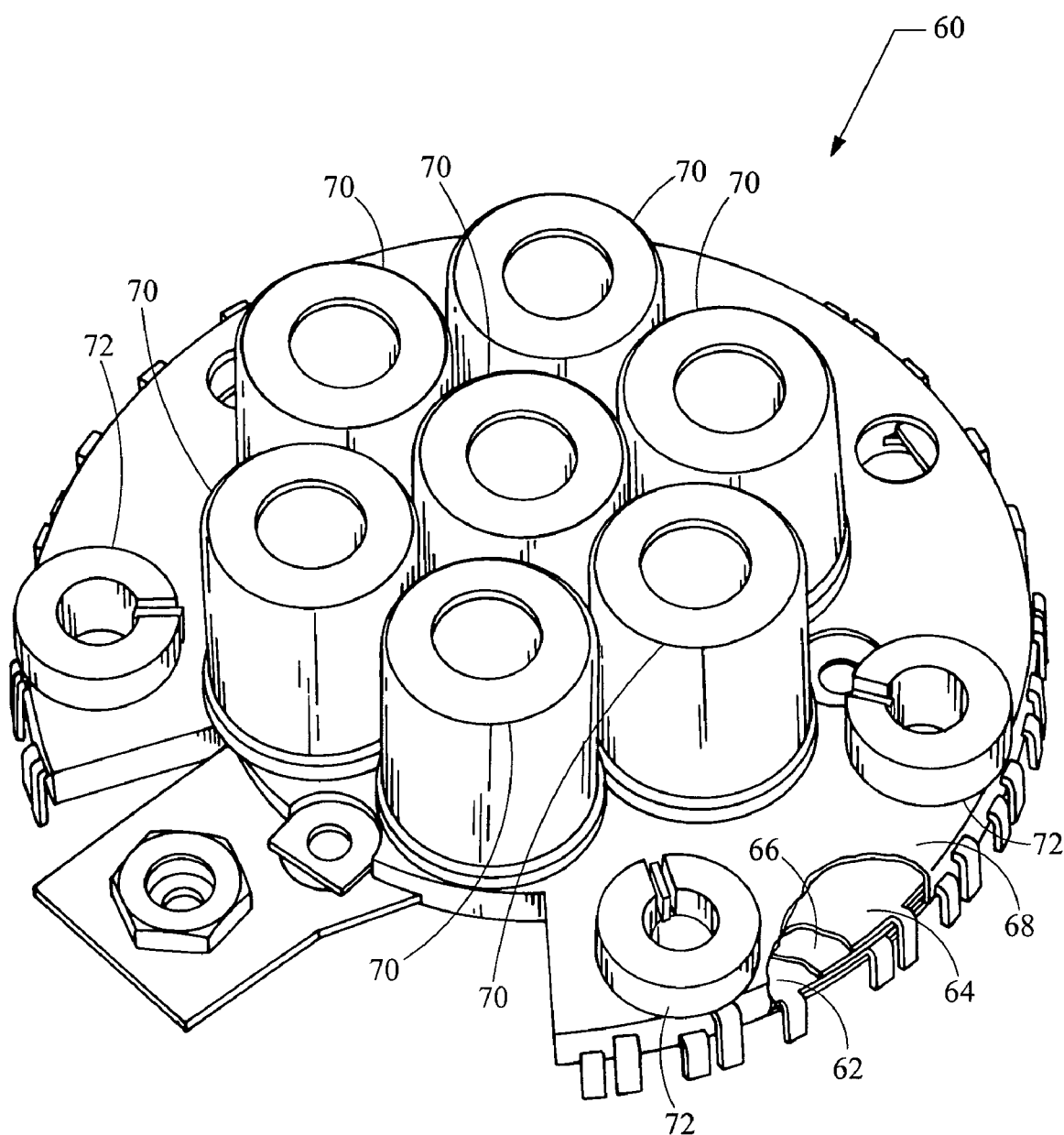
FIG. 3 is an top isometric view partially cutaway of a bus bar switch and electronics assembly in accordance with the principles of the present invention.

Now referring to FIG. 3, a top isometric view of an electronic assembly 60 for an electric machine is provided. The electronic assembly 60 includes the positive bus bar 62 configured as a plate generally in the shape of a disk. Similarly, the negative bus bar 64 is also configured as a plate positioned parallel or at least substantially parallel to the positive bus bar 62. The positive and negative bus bars 62, 64 each have a substantially flat surface 61, 63 with a dielectric layer 66 disposed therebetween. The parallel plate configuration increases the inductance between the positive and negative bus bars 62, 64, while also increasing the capacitance between the positive and negative bus bars 62, 64. An overmolded layer 68 may be provided to protect the positive and negative bus bars 62, 64 and secure them together.

Electrically connected between the positive and negative bus bars 62, 64 and mounted along the overmolded layer are capacitors 70. The capacitors 70 may be sonically welded or soldered to the positive and negative bus bars 62, 64.

Figure 4:
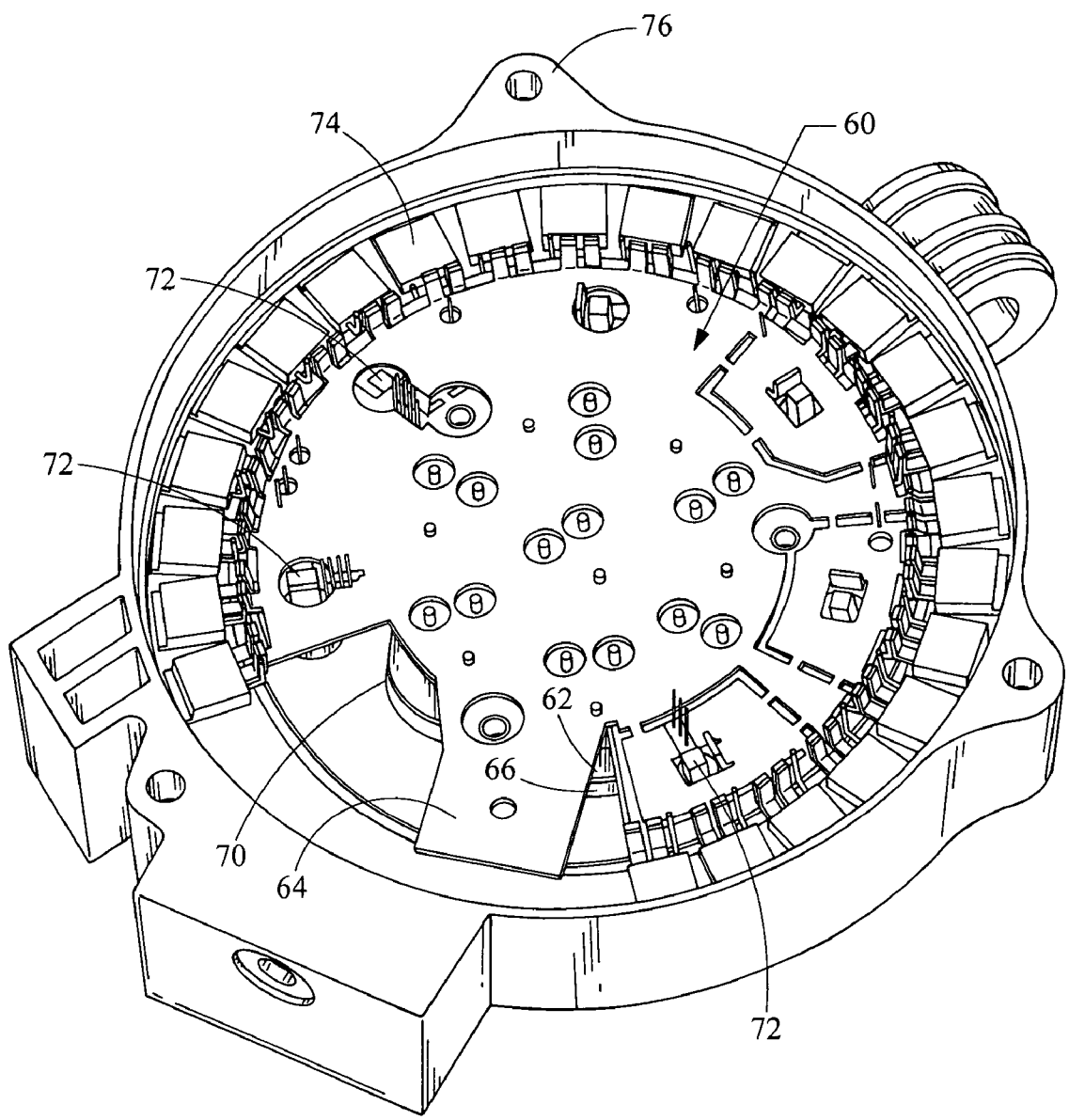
FIG. 4 is an bottom isometric view of a bus bar switch and electronics assembly in accordance with the principles of the present invention.

As seen in the isometric view of the bottom side of the electronic assembly 60 of FIG. 4, the switch circuits 74 (only some of which are labeled for clarity) are mounted in a symmetric, and in this instance circular, configuration around the positive and negative bus bars 62, 64. Similarly, the capacitors 70 are mounted such that the weighted capacitance of all of the capacitors 70 is equidistant from each of the switch circuits 74. As such, the switching delay between each of the switch circuits 74 is minimized, avoiding the potential of a switch circuit overload during a switching delay. The capacitors 70 are positioned in a symmetric, illustrated as circular, configuration, which is concentric with the configuration of switch circuits 74. The symmetric configuration shown provides a weighted average position of the capacitance that is equidistant from each of the switching circuits 74.

In addition, current sensors 72 may also be mounted on the overmolded layer 68 and connected to the positive and negative bus bars 62, 64. The parallel plate configuration of the positive and negative bus bars 62, 64 further allows the current sensors 72 to be mounted along the surface of the positive or negative bus bar 62, 64 providing a tighter integrated package. In addition, the connections of the current sensors 72, switching circuits 74, positive bus bar 62, and negative bus bar 64 may be easily routed to a single circuit board (not shown) further reducing the number of connections and simplifying the packaging of the electronics. The electronics assembly 60 may be mounted within a housing 76 (as shown in FIG. 4) or mounted externally to the housing 76. In both configurations, a tight packaging between the electric machine and controlling electronics is allowed.

Figure 5:
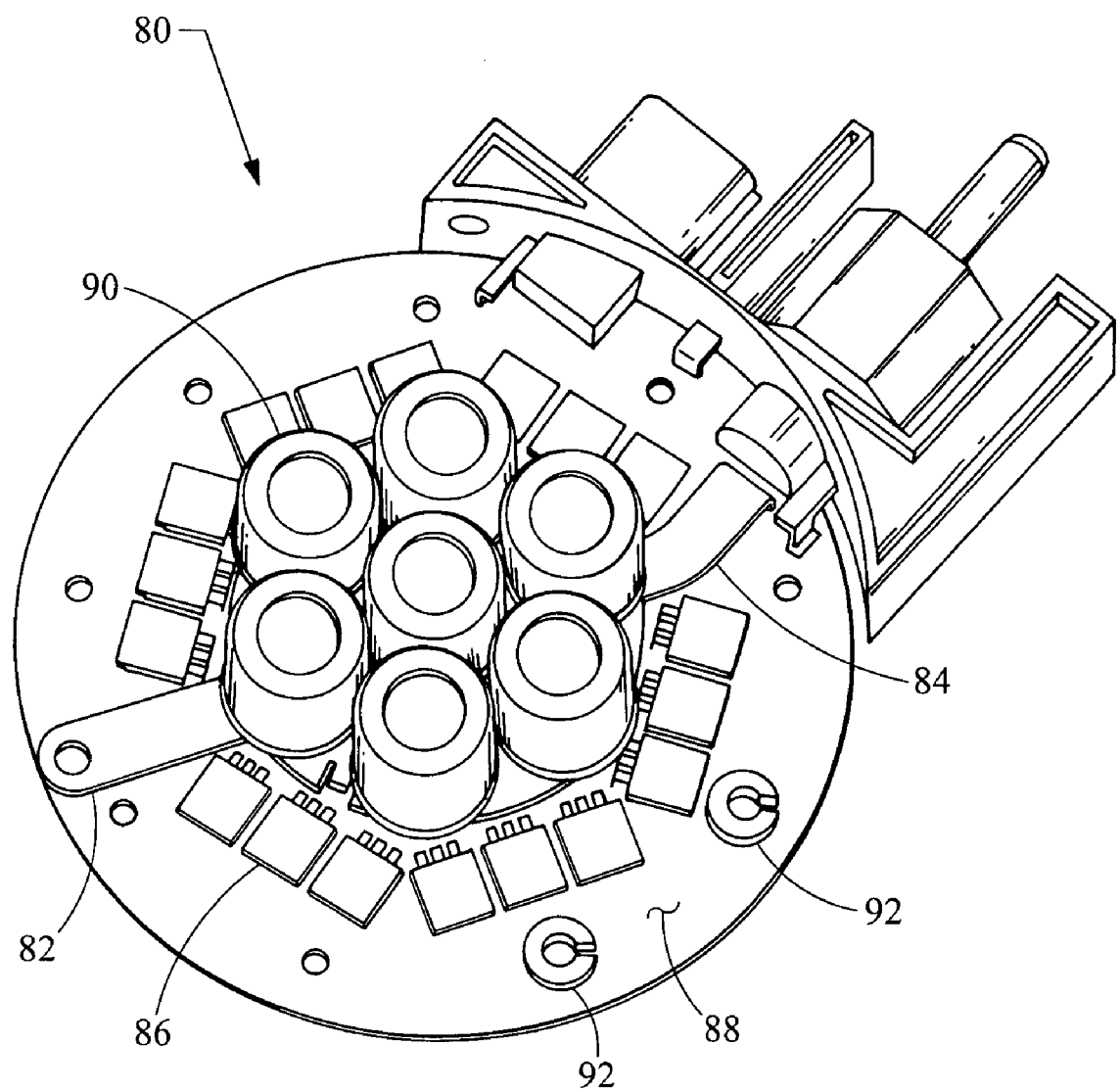
FIG. 5 is a top isometric view of another embodiment of a switch and electronics assembly in accordance with the principles of the present invention.

Now referring to FIG. 5, another embodiment for a permanent magnet machine is provided. An electronics assembly 80 includes switches 86, the positive bus bar 82, and the negative bus bar 84. The positive and negative bus bars 82 and 84 are configured in a parallel plate arrangement consistent with the previous embodiments. The switch circuits 86 are connected between the positive and negative bus bars 82, 84. However, the switch circuits 86 are configured in a symmetric hexagon arrangement, rather than the circular arrangement provided in the previous embodiments. The capacitors 90 are connected between the positive and negative bus bars 82, 84, to provide filtering and snubbing, similar to the previous embodiments. Current sensors 92 may also be located along the positive and negative bus bar 82, 84 to provide current input to the controlling electronics. In addition, FIG. 5 further depicts a circuit board 88 to illustrate the convenient and tight integration provided by the parallel plate configuration of the positive bus bar 82 and negative bus bar 84 allowing direct connection of the switch circuits 86 and current sensors 92 to the circuit board 88.

As a person skilled in the art will readily appreciate, the above description is meant as an illustration of implementation of the principles this invention. This description is not intended to limit the scope or application of this invention in that the invention is susceptible to modification, variation and change, without departing from spirit of this invention, as defined in the following claims.

We claim:

1. A circuit assembly for an electric machine having a plurality of windings, the control circuit comprising:
   a plurality of switch circuits in communication with the windings to selectively energize each of the windings;
   a first plate made of a conductive material connected to the plurality of switch circuits and configured to act as a positive bus bar; and
   a second plate made of a conductive material and configured to act as a negative bus bar, the second plate being substantially parallel to the first plate and being connected to the plurality of switch circuits.

2. The circuit assembly according to claim 1, wherein the plurality of windings are disposed in a machine housing and the switch circuits and plates are mounted to the machine housing.

3. The circuit assembly according to claim 1, wherein the plurality of windings are disposed in a machine housing and the switch circuits, first plate, and second plate are also disposed inside the machine housing.

4. The circuit assembly according to claim 1, wherein the switch circuits are mounted in a symmetric configuration along a surface of one of the first and second plates.

5. The circuit assembly according to claim 1, wherein the plurality of switch circuits are mounted in a circular configuration along a surface of one of the first and second plates.

6. The circuit assembly according to claim 1, further comprising a plurality of capacitors mounted in a circular configuration on a surface of one of the first and second plate.

7. The circuit assembly according to claim 6, wherein the plurality of capacitors are concentric with a circular configuration of the plurality of switch circuits.

8. The circuit assembly according to claim 1, further comprising a capacitive bank in electrical connection with the first and second plates wherein a weighted center of the capacitive bank is equidistant from each of the plurality of switch circuits.

9. The circuit assembly according to claim 1, further comprising a plurality of current sensors mounted along the surface of one of the first and second plates.

10. The circuit assembly according to claim 1, wherein each of the plurality of switch circuits includes a half bridge configuration connected between the first and second plates.

11. The circuit assembly according to claim 1, further comprising a dielectric layer disposed between the first and second plates.

12. The circuit assembly according to claim 11, wherein the dielectric layer is disposed between and in contact with a flat first surface of the first plate and a flat second surface of the second plate.

13. The circuit assembly according to claim 12, wherein the thickness of the dielectric layer is minimized to minimize inductance and maximize the capacitance between the first and second plate.

* * * * *